United States Patent [19]

Janssen

[11] Patent Number: 5,815,537
[45] Date of Patent: Sep. 29, 1998

[54] WIRELESS DIGITAL COMMUNICATION DEVICE, AND A PULSE SHAPING NETWORK

[75] Inventor: Daniel J. G. Janssen, Eindhoven, Netherlands

[73] Assignee: U.S. Philips Corporation, New York, N.Y.

[21] Appl. No.: 683,327

[22] Filed: Jul. 18, 1996

[30] Foreign Application Priority Data

Jul. 21, 1995 [EP] European Pat. Off. .............. 95202009

[51] Int. Cl.⁶ .................................................. H04B 1/10
[52] U.S. Cl. ............................................ 375/350; 333/20
[58] Field of Search .................................. 375/350, 296; 333/20; 395/27, 24

[56] References Cited

U.S. PATENT DOCUMENTS

| | | | |
|---|---|---|---|
| 3,871,767 | 3/1975 | Holm-Hansen et al. ............... | 356/215 |
| 4,410,955 | 10/1983 | Burke et al. ............................. | 364/718 |
| 4,585,952 | 4/1986 | Yamamoto ............................... | 307/268 |
| 4,773,001 | 9/1988 | Blair et al. .............................. | 364/200 |
| 4,871,987 | 10/1989 | Kawase .................................... | 332/100 |
| 5,247,657 | 9/1993 | Myers ...................................... | 395/550 |
| 5,424,881 | 6/1995 | Behrens et al. .......................... | 360/40 |
| 5,453,767 | 9/1995 | Chang et al. ............................ | 347/10 |
| 5,651,029 | 7/1997 | Yang et al. .............................. | 375/296 |
| 5,657,353 | 8/1997 | Hatcher et al. ......................... | 375/296 |

OTHER PUBLICATIONS

"Mobile Radio Communications", by R. Steele, Pentech Press, 1994, pp. 523–541.

*Primary Examiner*—Stephen Chin
*Assistant Examiner*—Mohammad Ghayour

[57] ABSTRACT

A wireless digital communication device having a pulse shaping network for pulse shaping digital signals before modulation. The pulse shaping network comprises a shift register to which data to be modulated are fed. Outputs of the shift register are connected to control inputs of switched weighted current sources. The switched weighted current sources are summed over an output resistor. An adjustment voltage for adjusting the magnitude of the shaped data is fed to one input of a differential amplifier, a reference resistor being coupled to another input of the amplifier, and to a reference current source which is mirrored into the switched weighted current sources. Thus, an accurate and easily adjustable pulse shaping network is obtained.

8 Claims, 3 Drawing Sheets

WIRELESS DIGITAL COMMUNICATION DEVICE, AND A PULSE SHAPING NETWORK

BACKGROUND OF THE INVENTION

The present invention relates to a wireless digital communication device comprising a modulator for modulating digital signals, the modulator being preceded by a pulse shaping network for pulse shaping the digital signals.

The present invention further relates to a pulse shaping network.

A pulse shaping network for a wireless digital communication device is known from the handbook "Mobile Radio Communications", R. Steele, Pentech Press, 1994, pp. 523–541. At page 530 of this handbook, a pulse shaping filter is described, and at page 534 Gaussian pulse shaping is described. For wireless communication devices for GSM (Global System for Mobile Communications) and DECT (Digital European Cordless Telecommunications) such a Gaussian pulse shaping is applied before modulation, the filter having a low pass characteristic with a normalized bandwidth of 0.5, the normalized bandwidth being the product of the bandwidth of the low pass filter and the bit period of the bits to be shaped. In the handbook of Steele only a general FIR-filter (Finite Impulse Response) description is given for the pulse shaping network.

SUMMARY OF THE INVENTION

It is an object of the present invention to provide a wireless digital communication device of the above kind having a specific pulse shaping network such that the modulation index of a succeeding modulator can be easily and accurately determined.

To this end the wireless digital communication device according to the present invention is characterized in that the pulse shaping network comprises a differential amplifier to one input of which a discretely adjustable voltage can be fed, and of which another input is coupled to a first terminal of a resistor which has a second terminal coupled to a first supply terminal, the other input further being coupled to a first terminal of a current source which is coupled via a second terminal to a second supply terminal, and in that the pulse shaping network further comprises a weighted-current network, the current source being mirrored into current sources of the weighted-current network. The amplitude of the shaped pulse can thus be accurately determined by adjusting the input voltage of the pulse shaping network, and thereby the modulation index of the succeeding modulator.

In an embodiment of a wireless communication device according to the present invention, the pulse shaping network comprises a shift register with an input for data to be modulated, the weighted current network comprises switched weighted current sources, and outputs of the shift register are coupled to control inputs of the switched current sources, an output of the pulse shaping network being formed by summing the switched weighted current sources. An advantage with respect to known pulse shapers in the form of a high pass filter with a usual 50 Ω output is then that the output can have a higher impedance, and thus power consumption is reduced. In particular in a handset for wireless communication this is advantageous.

In an embodiment of a wireless digital communication device according to the present invention, the communication device comprises a voltage reference arrangement for providing an accurate output voltage from a relatively inaccurate input reference voltage source, which arrangement comprises a differential amplifier of which a first input is coupled to the input reference voltage source, and of which an output is coupled to a second input of the differential amplifier, the output providing the accurate output voltage and being coupled to a supply terminal via a digitally controllable potentiometer of which a programmable slider can be coupled to the second input for adjusting inaccuracies in the input reference voltage source, whereby the voltage reference arrangement comprises at least one further output for providing a further accurate output voltage derivable from the output voltage of the differential amplifier, and a digitally controllable multiplexer for multiplexing the slider to the second input and to the at least one further output, and whereby the further accurate output forms the discretely adjustable voltage. As a result the modulation index can be simply adjusted by means of software to be loaded in a digital controller and programming the slider. Just a number loaded in a software register determines the modulation index. Also, inaccuracies in the transmitter part of the wireless digital communication device can be easily eliminated.

BRIEF DESCRIPTION OF THE DRAWINGS

The present invention will now be described, by way of example, with reference to the accompanying drawings, wherein.

Throughout the figures the same reference numerals are used for the same features.

DESCRIPTION OF THE PREFERRED EMBODIMENTS

Figure 1:
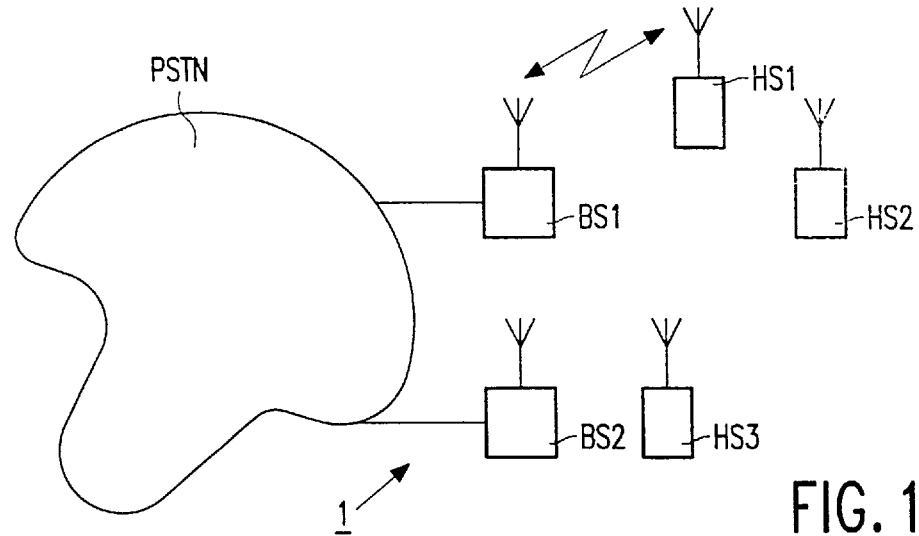
FIG. 1 schematically shows a wireless digital communication system.

FIG. 1 schematically shows a wireless digital communication system 1, in the given example a digital cordless telephony system in accordance with the DECT Standard (Digital European Cordless Communications) as standardized by ETSI (European Telecommunications Standards Institute). The system 1 comprises radio base stations BS1 and BS2 coupled to the public switched telephone network PSTN. Further shown are cordless handsets HS1, HS2, and HS3 which are arranged for bi-directional communication with the base stations to which they are authorized to communicate. Although the cordless system is shown in its simplest form, more elaborate systems concepts are possible, such as combinations with PABXs (Private Automatic Branch Exchange) with cordless extensions, Telepoint stations, forming of microcells with roaming, or the like. The present invention may be included into a transceiver of such a system, but may also be included into any other suitable device or system.

Figure 2:
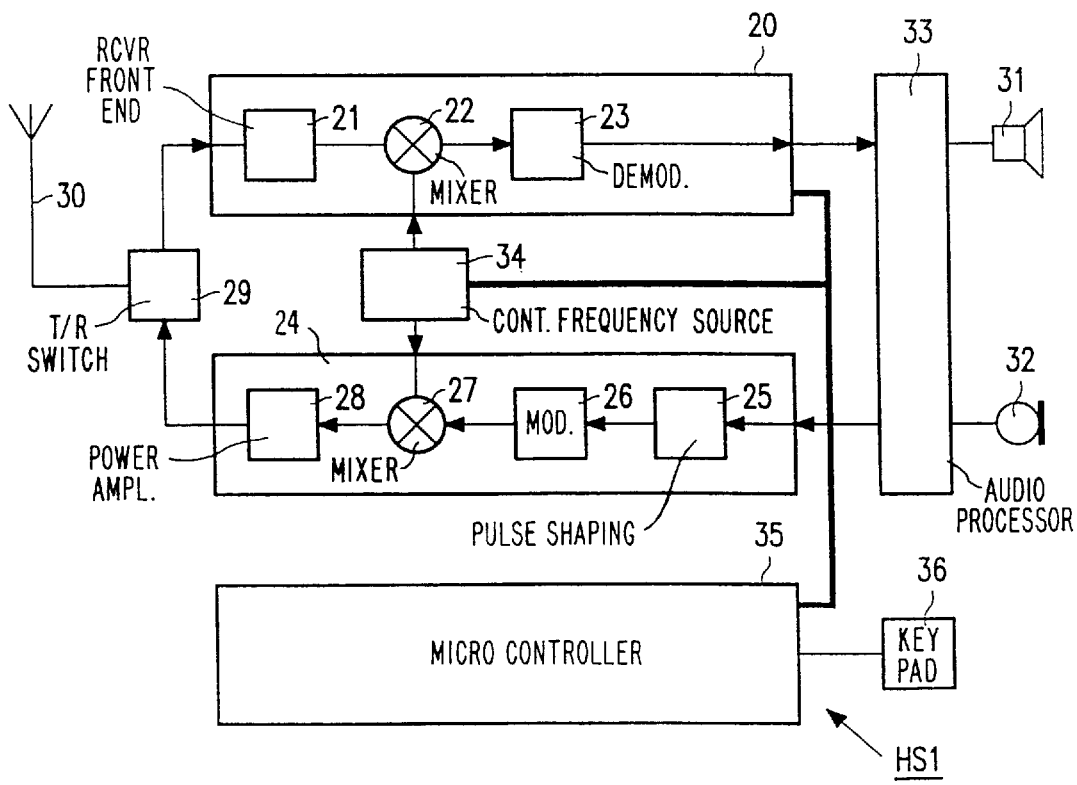
FIG. 2 shows a block diagram of the wireless digital communication device for use in a wireless digital communication system.

FIG. 2 shows a block diagram of the wireless digital communication device HS1, e.g. a DECT cordless handset, which comprises a receiver 20 having a receiver front-end 21, a mixer 22, and a demodulator 23. The device HS1 further comprises a transmitter 24 having a pulse shaping network 25, a modulator 26, a mixer 27, and a transmit power amplifier 28. At the RF-side, the receiver 20 and the transmitter 24 are coupled to a receive/transmit switch 29 which is coupled to an antenna 30. At the LF-side, the receiver 20 and the transmitter 24 are coupled to a telephone receiver or loudspeaker 31 and a microphone 32 via an audio processor 33. For tuning to a desired radio channel, the handset HS1 comprises a controllable frequency source 34. The handset HS1 is controlled by a microcontroller 35 which is coupled to the receiver 20, to the transmitter 24, to the controllable frequency source 34, and further to a keypad 36 for user control of the handset HS1. The microcontroller 35 comprises RAM, and ROM and other non-volatile memory (not shown) for executing stored programs, for storing predetermined data, and for storing temporary data. As far as the radio parts are concerned, the base station BS1 has a similar architecture.

Figure 3:
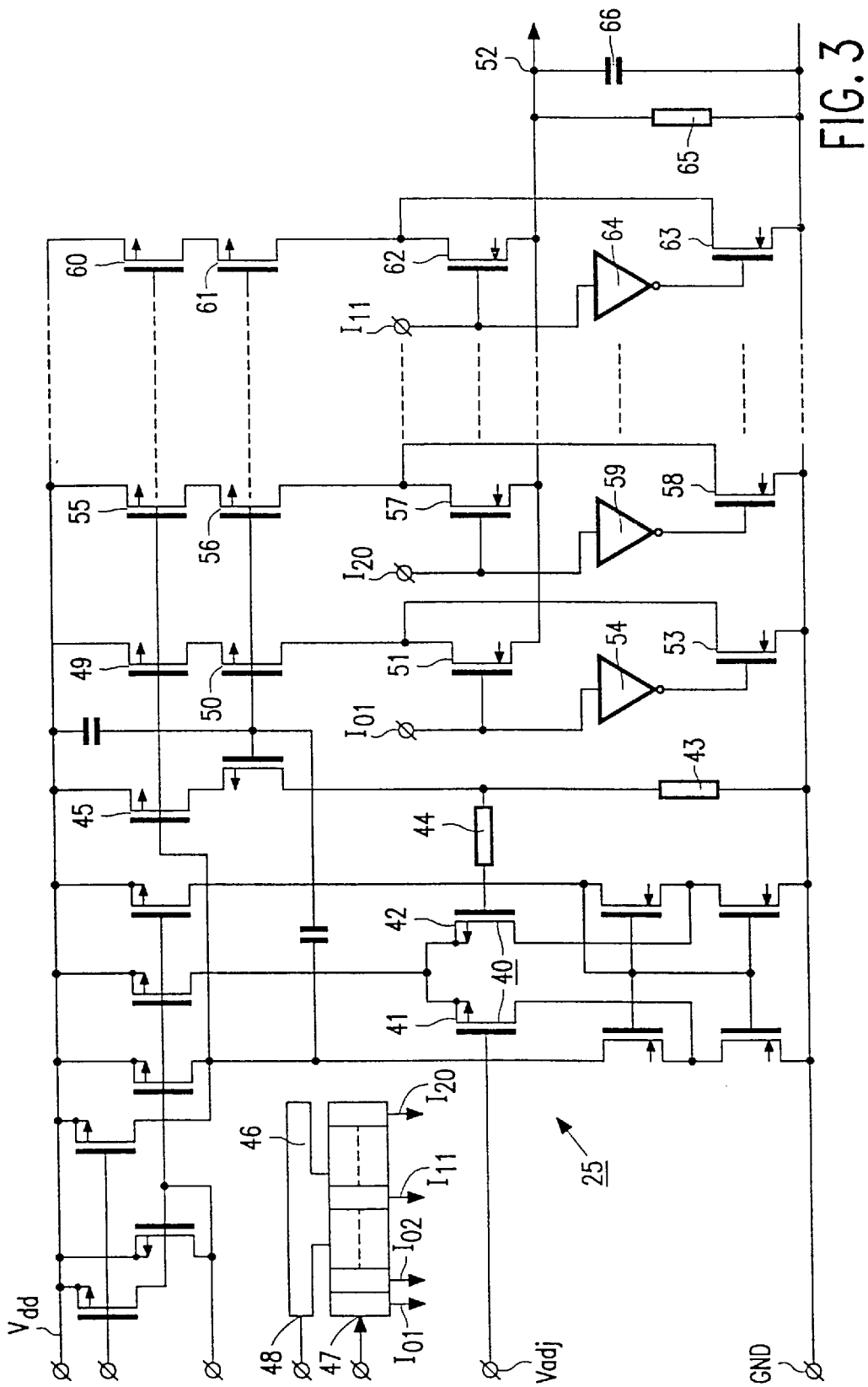
FIG. 3 shows a circuit diagram of a pulse shaping network according to the present invention.

FIG. 3 shows a circuit diagram of the pulse shaping network 25 according to the present invention. The pulse shaping network 25 comprises an input buffer 40. An output swing adjustment signal $V_{adj}$ is fed to an input MOS-transistor 41 of the buffer 40, another input MOS-transistor 42 of the buffer 40 has its control terminal coupled to a reference resistor 43 via a small resistor 44. The reference resistor 43 has its other terminal coupled to ground GND. In the given example, the resistor 44 has a value of 1 Ω, and the resistor 43 a value of 10 kΩ. A reference current source 45 is coupled between a positive supply terminal $V_{dd}$ and the reference resistor 43. Other MOS-transistors in the left upper part of FIG. 3 are intended for biasing or the like and are not further described in detail. The pulse shaping network 25 further comprises a plurality of switched weighted current sources which are controlled by outputs $I_{01}$, $I_{02}$, ..., $I_{11}$, ... $I_{20}$ of a shift register 46 coupled to a data input 47 which supplies data to be shaped before modulation. The shift register 46 further comprises a clock input 48 for clocking the shift register 46. The shift register 46 should be clocked such that the data to be shaped are oversampled. Shown are a switched weighted current source formed by a series arrangement of MOS-transistors 49, 50, and 51 between the supply terminal $V_{dd}$ and an output terminal 52 of the pulse shaping network 25, and by a MOS-transistor 53 with its drain to the drain coupled of the transistor 51, and with its source to the ground terminal GND. The control signal $Y_{01}$ is fed to the gate of the transistor 51, and to the gate of the transistor 53 via an inverter 54. The reference current source 45 is mirrored into the switched weighted current sources so that all weighted current sources are matched to the reference current source. Similarly, switched weighted current sources are shown for $I_{20}$ and $I_{11}$, formed by transistors 55, 56, 57, and 58, and by an inverter 59, and by transistors 60, 61, 62, and 63, and by an inverter 64, respectively. When applying a 20 bits shift register 46, there are 20 weighted current sources $I_{01}$, $I_{02}$, ..., $I_{20}$ with a similar structure. All switched weighted currents are summed in a resistor 65 that can have a value of 500 Ω. The weighting factors are chosen such that the voltage across the resistor 65 equals $V_{adj}$ when all current sources of the weighted current network are switched on. When the pulse shaping network 25 is implemented in an IC, undesired HF-components can be filtered out by means of a single external capacitor 66, e.g. having a value of 200 pF. At the IC, switched weighted current sources are paired when implementing a symmetric weighting function such as a Gaussian function, i.e. $I_{01}$ and $I_{20}$ are put next to each other on a chip, $I_{19}$ and $I_{02}$, and so on. Weighting factors of the weighted current sources are determined by the desired filter function, e.g. a GMSK-function with BT=0.5 as prescribed for DECT and GSM. The source areas of the transistors in the weighted current sources are chosen such that the desired weighting function is obtained. A modulation index of the modulator 26 coupled to the pulse shaping network can simply be varied by varying the adjustment signal $V_{adj}$.

Figure 4:
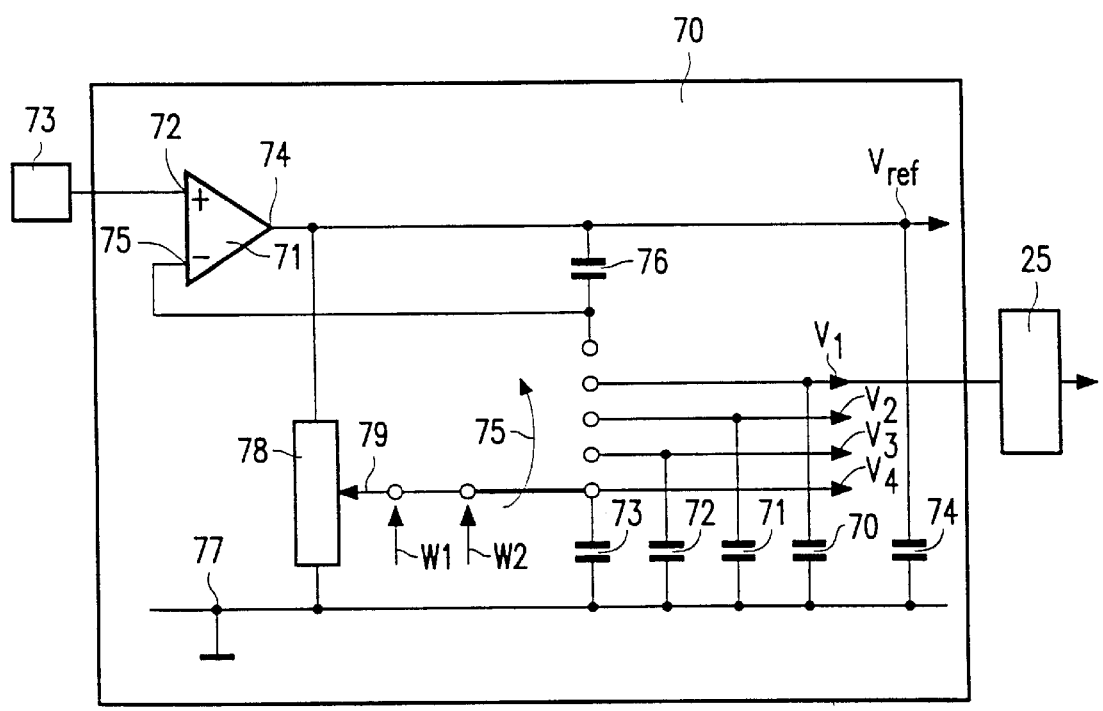
FIG. 4 shows a pulse shaping network according to the present invention in combination with a digitally controllable voltage reference arrangement.

FIG. 4 shows the pulse shaping network 25 according to the present invention in combination with a digitally controllable voltage reference arrangement 70 for providing an accurate output voltage $V_{ref}$. The arrangement 70 comprises a differential amplifier 71 of which a first input 72 is coupled to a relatively inaccurate input reference voltage source 73 that can be a so-called bandgap reference circuit such as that incorporated within the integrated circuit type PCD5032. Such a bandgap reference typically has an exemplary spread of 5%. An output 74 of the differential amplifier 71 is coupled to a second input 75 of the differential amplifier 71 via a first capacitor 76, and is further coupled to a supply terminal 77 via a digitally controllable potentiometer 78 of which a slider 79 is controllable by means of a digital word WI. After coupling of the bandgap reference 73 to the voltage reference arrangement 70, inaccuracies in the input voltage reference source can be adjusted such that the output voltage $V_{ref}$ has a desired value, e.g. 2 volt. An adjustment value can be stored in a non-volatile memory included in the microcontroller 35. According to the present invention, the arrangement 70 can provide further accurate output voltages $V_1$, $V_2$, $V_3$, and $V_4$ from the same digital potentiometer 78. These voltages can be determined after coupling of the bandgap reference 73 to the voltage reference arrangement 70, or, afterwards. The voltages $V_1$, $V_2$, $V_3$, and $V_4$ are generated across respective capacitors 70, 71, 72, and 73 by digitally controlling a multiplexer 75 by means of a digital word W2, whereas the voltage $V_{ref}$ is generated across a capacitor 74. According to the present invention, the slider 49 is thus used for both input and output voltages. The potentiometer 78 can be controlled by an 8 bit word W1 in the microcontroller 35. Herewith, the potentiometer has a resolution of 8 mV. The voltages across the capacitors 70, 71, 72, 73, and 74 are frequently updated. The thus digitally controllable voltage $V_1$, is fed to the pulse shaping network 25 as the adjustment voltage $V_{adj}$. If the current matching in the pulse shaping network is imperfect or if other imperfections in the transmitter 24 are to be adjusted, the setmaker can simply adjust the potentiometer value for the voltage $V_1$ and store a corrected value in a non-volatile memory such an EEPROM included in the microcontroller 35.

I claim:

1. A wireless digital communication device comprising: a modulator for modulating digital signals, the modulator being preceded by a pulse shaping network for pulse shaping the digital signals, characterized in that the pulse shaping network comprises a differential amplifier having a first input to which a discretely adjustable voltage can be fed, and having a second input coupled to a first terminal of a resistor which has a second terminal coupled to a first supply terminal, the second input also being coupled to a first terminal of a current source which has a second terminal coupled to a second supply terminal, and in that the pulse shaping network further comprises a weighted-current network, the current source being mirrored into current sources of the weighted-current network.

2. A wireless digital communication device according to claim 1, wherein the pulse shaping network comprises a shift register with an input for data to be modulated, the weighted-current network comprises switched weighted-current sources, and outputs of the shift register are coupled to control inputs of the switched current sources, and means for summing the switched weighted-current sources to provide an output of the pulse shaping network.

3. A wireless digital communication device according to claim 1, comprising a voltage reference arrangement for providing an accurate output voltage from a relatively inaccurate input reference voltage source, which arrangement comprises a differential amplifier of which a first input is coupled to the input reference voltage source, and of which an output is coupled to a second input of the differential amplifier, the output providing the accurate output voltage and being coupled to a supply terminal via a digitally controllable potentiometer of which a programmable slider can be coupled to the second input for adjusting inaccuracies in the input reference voltage source, whereby the voltage reference arrangement comprises at least one further output for providing a further accurate output voltage derivable from the output voltage of the differential amplifier, and a digitally controllable multiplexer for multiplexing the slider to the second input and to the at least one further output, and wherein the further accurate output forms the discretely adjustable voltage.

4. A wireless digital communication device according to claim 1, wherein the pulse shaping is Gaussian.

5. A pulse shaping network for pulse shaping digital signals comprising, a differential amplifier having a first input to which a discretely adjustable voltage can be fed, and having a second input coupled to a first terminal of resistor which is coupled via a second terminal thereof to a first supply terminal, the second input also being coupled to a first terminal of a current source which is coupled via a second terminal thereof to a second supply terminal, and in that the pulse shaping network further comprises a weighted-current network, the current source being mirrored into current sources of the weighted-current network.

6. The pulse shaping network according to claim 5 which further comprises a shift register having an input for data to be modulated, wherein the weighted-current network comprises switched weighted-current sources, and outputs of a shift register are coupled to control inputs of the switched current sources, and means for summing the switched weighted-current sources to provide an output of the pulse shaping network.

7. A pulse shaping network for digital signals comprising:
a differential amplifier having a first input and a second input with the first input coupled to an input terminal which supplies an adjustable voltage that determines the amplitude of a shaped pulse produced at an output terminal of the pulse shaping network, and the second input is coupled to a first supply terminal via a resistor,
means coupling the second input of the differential amplifier to a first terminal of a first current source which is in turn coupled to a second supply terminal,
a weighted-current network having a plurality of switched current sources mirrored to said first current source,
means for summing currents supplied by the switched weighted-current sources, and
means coupling said output terminal to said summing means.

8. The pulse shaping network according to claim 7 which further comprises a shift register having an input for data to be modulated, and means for coupling outputs of the shift register to respective control inputs of the switched current sources.

* * * * *